United States Patent [19]

Gregg, Jr.

[11] 4,208,626
[45] Jun. 17, 1980

[54] PRECISION TIMING SOURCE FOR MULTIPLE RATE SAMPLING OF HIGH-SPEED WAVEFORMS

[75] Inventor: Roland S. Gregg, Jr., Canoga Park, Calif.

[73] Assignee: Bunker Ramo Corporation, Oak Brook, Ill.

[21] Appl. No.: 883,363

[22] Filed: Mar. 6, 1978

[51] Int. Cl.² .............................................. G01R 23/16
[52] U.S. Cl. ................................ 324/77 A; 324/79 D
[58] Field of Search ................ 324/77 R, 77 A, 79 D, 324/78 D

[56] References Cited

U.S. PATENT DOCUMENTS

| 3,657,646 | 4/1972 | Zinyslowski | 324/77 A |
| 3,978,403 | 8/1976 | Mansfield | 324/77 A |
| 4,053,831 | 10/1977 | Furukawa | 324/77 A |

*Primary Examiner*—M. Tokar
*Attorney, Agent, or Firm*—F. M. Arbuckle; N. A. Camasto

[57] ABSTRACT

An apparatus useful in a system for analyzing an input waveform for generating precisely-timed strobe sampling pulses. In response to detection of the waveform leading edge, a timing source operating at a very high frequency initiates a series of strobe pulses which occur at a considerably lower frequency. The strobe pulses are then used to successively sample the waveform. Depending upon the time duration of the input waveform, the waveform can be sampled at different effective rates by utilizing the same series of strobe pulses and disregarding selected samples.

10 Claims, 2 Drawing Figures

PRECISION TIMING SOURCE FOR MULTIPLE RATE SAMPLING OF HIGH-SPEED WAVEFORMS

BACKGROUND OF THE INVENTION

The Government has rights in this invention pursuant to Contract N00014-75-C-0488 awarded by the Department of the Navy.

This invention relates to a stable sample rate generator particularly useful in signal processing systems for analyzing and identifying signal waveforms.

In such signal processing systems, it is important to be able to sample an input analog waveform at very precise time locations, generally related to the waveform leading edge. Variations in sampling times introduce ambiguities when attempting to calculate the spectral components and identify characteristics of the waveform. In order to minimize such ambiguities, sampling strobe pulses are typically generated at the highest frequency rate compatible with the system and equipment capabilities.

SUMMARY OF THE INVENTION

In accordance with the present invention, the timing ambiguity associated with the sampling of an analog waveform is reduced to a value defined by the timing resolution of a very high frequency clock, rather than that of the actual strobe sampling rate which is generally limited by the operating speed of various sampling components to a maximum frequency considerably lower than that of the clock. In a preferred embodiment, the detection of the input waveform leading edge causes a free-running source oscillator producing a high-frequency clock to initiate the generation of a train of uniform strobe pulses occurring at a lower frequency. The input waveform is then sampled at the maximum rate indicated by the strobe pulses.

It sometimes proves impractical to process all of the data collected at the maximum sampling rate should the time duration of the analog waveform be lengthy. Therefore, in accordance with a further feature of the invention, means are provided for deriving samples of the analog waveform at multiple effective rates which comprise fractional values of the maximum sampling rate. Recognizing that it is advantageous to maintain the timing integrity and resolution of those data samples which have been obtained by constantly sampling the input waveform at the maximum strobe pulse rate, the present invention stores into memory only a specified proportion of the digital samples while, at the same time, discarding any data samples not stored. In this manner, the invention can effectively provide for the requisite multiple sampling rates.

Selection of the most appropriate sampling rate in accordance with the present invention is performed in either of two operating modes. The first is nominally a manual mode wherein an operator bases his or her rate selection solely upon his or her personal judgment. The second mode is a dynamic or automatic operation in which the analog pulse waveform is both stored in a delay line and preliminarily processed during a first pass to, for example, ascertain the waveform duration. A short time duration will indicate that the waveform can be sampled at a high sampling rate while a longer duration will indicate that the waveform must be sampled at a slower sampling rate. Following the first pass the waveform is accessed from the delay line and sampled. Selected samples are then stored in memory at the sampling rate which was determined during the first pass as being most appropriate and the rest are discarded. Those samples written into memory are subsequently read out to coefficient extraction logic, which derives the Fourier coefficients therefrom.

The novel features of the invention are set forth with particularity in the appended claims. The invention will best be understood from the following description when read in conjunction with the accompanying drawings.

DESCRIPTION OF THE PREFERRED EMBODIMENT

Figure 1:
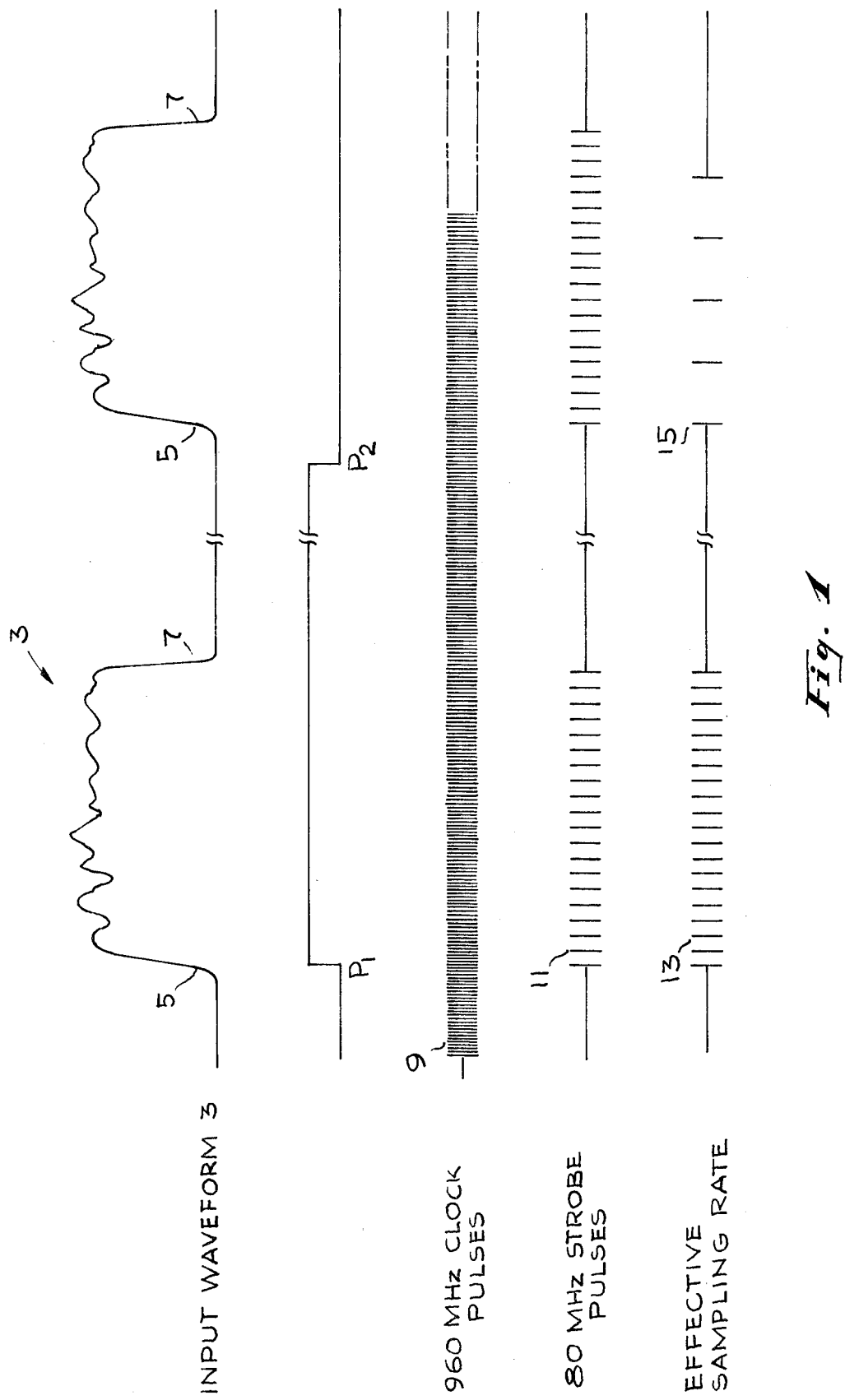
FIG. 1 is a graph illustrating the sampling of an input signal waveform.

Attention is now directed to FIG. 1, wherein an input signal waveform 3 is depicted graphically in a plot of voltage versus time. The analog waveform 3 is distinctively characterized by a series of varying peaks and valleys preceded in time by a leading edge 5. Waveform leading edge 5 is marked by a sharp increase in the slope and amplitude of the input signal. Waveform 3 is also characterized by a trailing edge 7, which is marked by a sharp increase in slope and decrease in the amplitude. Identification and analysis of the input signal 3 is performed in the present invention by sampling the waveform to ascertain its amplitude at spaced points in time having a precise relationship with respect to the leading edge. Orientation with respect to the leading edge insures the reproducibility and accuracy of samples taken in both single and multiple system networks.

Figure 2:
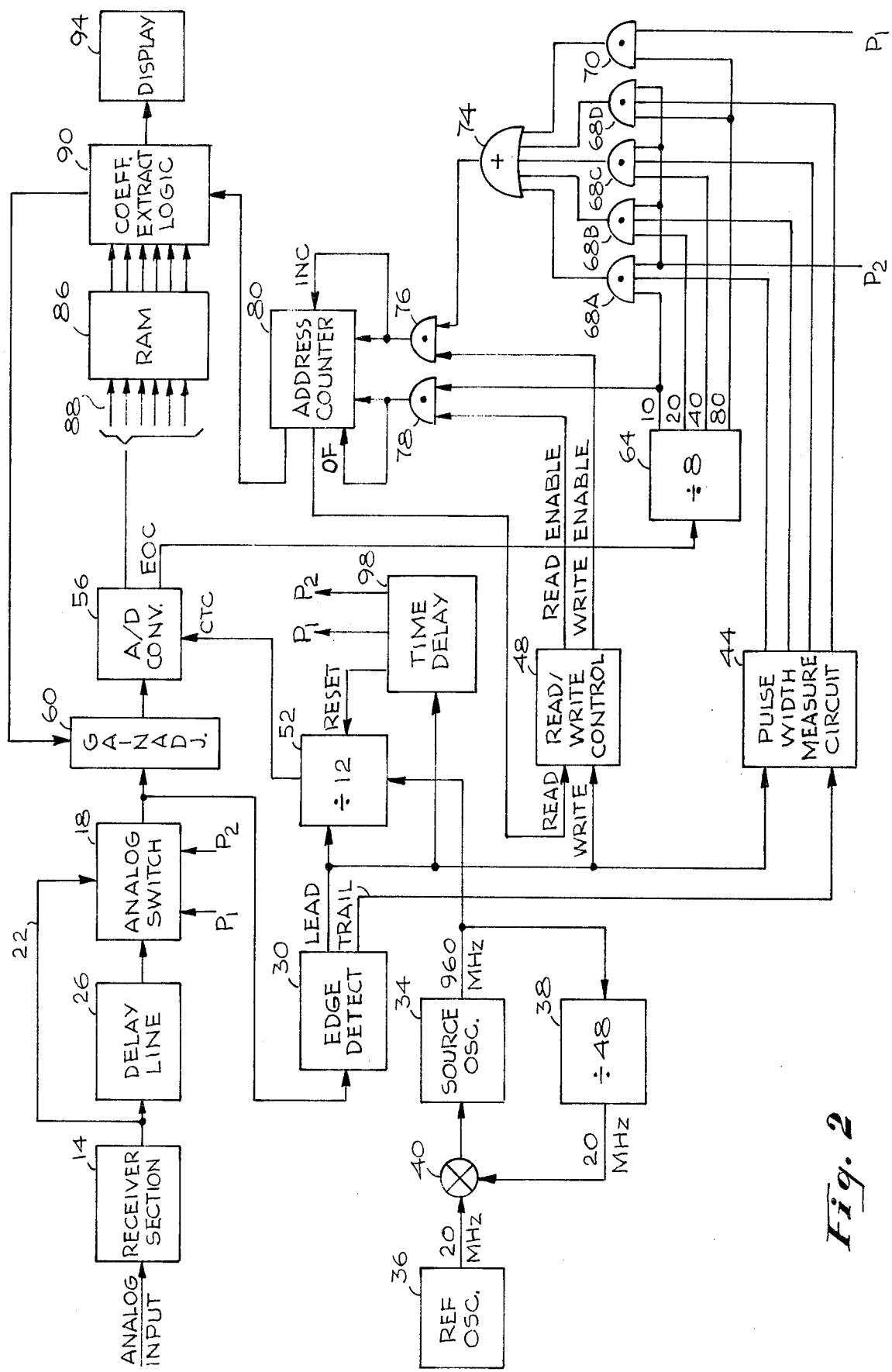
FIG. 2 is a schematic block diagram illustrating a preferred embodiment of the invention.

A uniform train of clock pulses 9 is generated by a very high frequency timing source (FIG. 2). When the leading edge 5 of analog waveform 3 is detected, a series of strobe pulses 11 occurring at a lower frequency than the pulses 9 are synchronously initiated to sample waveform 3 at discrete and uniform time intervals. It should be noted that although the strobe pulses 11 are at a lower frequency, they are initiated in response to the first high frequency clock pulse occurring after detection of the leading edge 5. In this manner, timing ambiguities are minimized since the strobe pulses 11 will be assured of having a timing resolution essentially equal to that of the higher frequency clock pulses 9.

In the preferred embodiment of the present invention, a timing precision within approximately one nanosecond can be attained by generating clock pulses 9 at a frequency on the order of 960 MHz. The strobe sample pulses 11 are derived directly from the clock pulses by reducing the latter down to a lower frequency such as 80 MHz. The 80 MHz frequency has been assumed to represent the maximum sampling rate at which analog waveform 3 can be sampled and converted to a digital representation.

Since it is not always practical to store and process the large number of samples obtained at the maximum strobe rate if the time duration of the input waveform is very long, in accordance with the present invention, a selected proportion of the samples are discarded. For purposes of example only, the invention will disregard one in every two data samples and thereby reduce the effective strobe sampling rate by a factor of two.

The selection of the most appropriate sampling rate is a function of the time duration or width of each input waveform 3. Time duration is defined as the time elapsed between a leading edge 5 and a trailing edge 7. In one embodiment of the invention, an automatic mode dictates that waveform 3 be sampled in two passes. During the first pass (as indicated by a status signal $P_1$), the input wveform is strobe sampled at the maximum strobe rate 11. No sample is disregarded; each sample being written into a memory unit at a frequency 13 equaling strobe rate 11. At the same time, the width of waveform 3 is ascertained by clocking the leading and trailing edges with clock pulses 9. The same waveform then undergoes a second and final pass (indicated by status signal $P_2$) during which it is sampled at the maximum strobe sampling rate 11 but only a certain portion of the samples are stored in memory for subsequent processing.

Referring now to FIG. 2, a receiver section 14 intercepts via suitable antenna terminals (not shown) an analog input waveform, which has been transmitted from an unknown source. As noted above, proper identification and analysis of the analog signal is accomplished in the present invention by successively strobe sampling the waveform characteristics at uniform discrete time intervals. The sampling of the waveform is synchronized to commence upon detection of the waveform's leading edge. In this manner, the reproducibility and accuracy of samples obtained by multiple networks can be enhanced since all of the samples gathered will be oriented in time with the leading edge.

The invention comprises both an automatic and a manual mode of operation. Sampling of the input waveform in the automatic mode, which will be disclosed first, is carried out in two consecutive passes. During a first pass $P_1$, the input signal is relayed directly from receiver section 14 to an analog switch 18 via a bypass bus 22. At the same time, the signal is also relayed into a delay line 26, the primary function of which is to temporarily store and time delay the analog waveform 3 while awaiting the second pass $P_2$. Enabled by status signals evidencing either $P_1$ or $P_2$, the analog switch 18 thus looks directly to receiver section 14 for its input during the first pass $P_1$ or, alternatively, to the delay line 26 during the second pass $P_2$.

Orientation with respect to the leading edge of the waveform precedes the actual strobe sampling of the input signal. To this end, an edge detector device 30 is connected to the analog switch 18 to precisely ascertain the time location of the waveform's leading edge 5. Edge detector 30 also has the capability of precisely ascertaining the trailing edge 7 of the waveform, as well. Since devices are readily known in the art for detecting waveform leading and trailing edges, the details of detector 30 will not be discussed herein.

The preferred embodiment of the invention employs a timing source 34 comprising a free-running oscillator operating at a frequency of 960 MHz. The clock pulses produced by the free-running oscillator correspondingly have a period of $(960 \text{ MHz})^{-1}$ or approximately 1 nanosecond. The source oscillator 34 is built in a phase-locked loop thereby making it possible for the frequency stability of the 960 MHz source oscillator to be maintained at a level of performance comparable to that exhibited by a second and more stable crystal-controlled reference oscillator 36 operating at a much lower frequency. More particularly, the output of free-running oscillator 34 is connected in series with a frequency divider unit 38. Frequency divider 38 reduces the 960 MHz signal by a factor of 48 to a lower frequency comparable to that of the crystal-controlled reference oscillator 36. The resultant 20 MHz signal from frequency divider 38 then is applied to a phase comparator device 40 together with the 20 MHz signal emanating from the more stable crystal-controlled oscillator 36. The output from the phase comparator 40 provides immediate feedback into the 960 MHz source oscillator 34 insuring increased timing stabilization.

Once the leading edge 5 of the input waveform 3 has been detected, a LEAD signal is generated by the detector and subsequently transmitted to a pulse width measure circuit 44, the function of which will be disclosed in detail below. The same LEAD signal is applied to the WRITE signal input of a read/write control switch 48, the function of which will also be disclosed below. In addition, the LEAD signal from edge detector 30 also activates a frequency divider or counter 52 which, as will be seen hereinafter, generates strobe pulses. In the preferred embodiment, the strobe pulse generator means comprises a resettable frequency divider 52 which, upon activation, divides the 960 MHz signal supplied thereto from oscillator 34 and outputs a uniform train of 80 MHz strobe pulses to be employed in the sampling of the input analog signal. In this manner, the 80 MHz strobe sampling pulses are initiated in response to the leading edge 5 of the input signal waveform after a delay which on the average will be only one half of the period of the 960 MHz clock. The 80 MHz strobe rate, which has been assumed to be the maximum operating frequency of the analog-to-digital converter 56 constitutes the basic rate at which the input signal is to be sampled.

Each 80 MHz strobe pulse produced by frequency divider 52 is supplied to analog-to-digital converter unit 56 as a command-to-convert (CTC) signal, which triggers the converter 56 to cause the sampling of the input waveform. At the same time, the input signal is itself transmitted from analog switch 18 to the analog-to-digital converter after passing through a gain adjustment device 60, the function of which will be disclosed below. Each strobe pulse causes the converter 56 to convert the amplitude of the input signal at a discrete moment in time with reference to the leading edge, to a digital form represented by six bits. The conversion process is preferably carried out by utilizing a conventional high-speed flash encoding technique.

After each individual sample is digitized, the analog-to-digital converter 56 generates an end-of-convert (EOC) signal. The 80 MHz EOC signal triggers a frequency divider 64, which is implemented in the preferred embodiment by a "divide-by-eight" counter. Frequency divider 64 generates four signals at frequencies of 10, 20, 40 and 80 MHz. Each of the four signals is inputted into one of four AND gates 68A, 68B, 68C, 68D, respectively. In addition, the 80 MHz signal also is applied to the input of AND gate 70. Gate 70 can be distinguished from the previous four AND gates 68 by noting that gate 70 has a $P_1$ status signal input, which is activated during the first pass of the invention's automatic mode. In contrast, the four AND gates 68A, 68B, 68C, 68D possess a $P_2$ rather than a $P_1$ status signal input; the $P_2$ signal being activated during the second pass while, at the same time, gate 70 is inhibited. The outputs of AND gates 68 and 70 are connected in parallel to a single OR gate 74, which in turn forms an input to a write command AND gate 76.

The write command AND gate 76 is itself enabled by a WRITE ENABLE signal transmitted to it from the read/write control switch 48. Depending upon its input being either a WRITE or a READ signal, control switch 48 generates a WRITE ENABLE or a READ ENABLE signal, respectively. As noted above, the WRITE input for switch 48 is derived from the LEAD signal generated earlier by edge detector 30. In the presence of an active WRITE ENABLE signal, the write command gate 76 thus increments an address counter 80 associated with memory 86 at one of the four possible frequency rates determined by the output of pulse width measure circuit 44. That is, if circuit 44 determined during pass $P_1$ that the input signal was of short duration, then it will enable gate 68D to increment address counter 80 at an 80 MHz rate to store all of the samples produced by converter 56 at the 80 MHz rate. If, on the other hand, circuit 44 determined that the input signal was of long duration, then it will enable gate 68A, for example, to increment address counter 80 at a 10 MHz rate to store only every eighth sample produced by converter 56.

Since an 80 MHz rate is always used to store samples in memory 86 during the first pass the memory capacity can overflow in the event the input signal is of long duration. The address counter 80 represents the number of memory addresses currently being used in RAM 86 to store the digital data samples since, of course, it is automatically incremented by one each time a sample is written into the memory. When address counter 80 generates on overflow (OF) indicating that the memory 86 is full (e.g., thirty-two samples), the counter transmits a READ signal back to the read/write control switch 48 and enables coefficient extraction logic 90. Switch 48 in turn generates a READ ENABLE pulse directed to a read command AND gate 78. The read command AND gate 78 then causes the stored samples to be read out of RAM 86 into coefficient extraction logic 90 at a 10 MHz rate. The slower 10 MHz frequency is compatible with standard Schottky TTL processing rates. Output is provided from the extraction logic to a suitable display device 94, such as a CRT. The coefficients may be displayed in digital form or, if desired, converted back to analog voltages. In the preferred embodiment, a signal is also transmitted from coefficient extraction logic 90 to the gain adjustment device 60, which is located between analog switch 18 and converter 56. Since the amplitude of each input signal sample is represented by only six binary bits, the samples consequently are restricted to one of $(2)^6$ or 64 values. By providing feedback to the gain adjustment device 60 during the first pass $P_1$ the resolution of samples taken during the second pass $P_2$ may be enhanced dependent upon the dynamic range of the input signal monitored during the first pass.

The timing levels $P_1$ and $P_2$ are generated by a time delay circuit 98 which is triggered to start by detection of the input signal leading edge during pass $P_1$. More particularly, assume that circuit 98 is in its quiescent state $P_1$. As soon as edge detect circuit 30 recognizes the input waveform leading edge, the counter 52 is reset. Then, after a predetermined delay which is selected based upon the delay duration of delay line 26, the circuit 98 switches to state $P_2$. After another fixed predetermined duration, it will switch back to its quiescent state $P_1$ with the system awaiting a subsequent input waveform.

The sampling procedure performed during passes $P_1$ and $P_2$ is basically the same. One key difference between the two passes, however, is that not all of the samples obtained by the analog-to-digital converter need be automatically written into the memory 86 during the second pass. Rather, the present invention selects the single most efficient sampling rate as a function of the time duration or width of the input waveform. It is uneconomical to gather a large number of strobe samples at the maximum 80 MHz sampling rate when profiling an input waveform having a particularly long time duration; it being more efficient to have less data gathered at a slower effective sampling rate. As noted above, the present invention maintains the integrity of the sampling by pruning the number of samples only after the converter unit 56 has obtained them at the maximum 80 MHz strobe rate.

Information relating to the time duration or width of the input waveform is gathered during the first pass $P_1$ by the pulse width measure circuit 44. The LEAD and TRAIL signals transmitted to the circuit 44 from edge detector 30 provide the basis for determining the duration of the input waveform. The pulse width measure circuit 44 utilizes that information to select the single most appropriate sampling rate. In the preferred embodiment, the effective rate is limited to a choice between 80, 40, 20 and 10 MHz; the four frequencies respectively equalling or being fractions of the maximum 80 MHz strobe rate. After selecting the most suitable sampling rate, the pulse width measure circuit 44 transmits an enabling signal to only one of the four AND gates 68A, 68B, 68C, 68D. As noted above, each AND gate receives as input a different frequency signal from frequency divider 64. Depending upon which sampling rate has been selected by the pulse width measure circuit 44, a signal is sent to the corresponding AND gate 68 while the remaining three AND gates 68 are inhibited.

Sampling of an input waveform can be performed by a manual mode of the present invention, as well as by the automatic mode disclosed hereinabove. In the manual mode, however, there is no need to employ more than one pass. Rather, the first pass need not be carried out because the most appropriate sampling rate is selected by the operator. In practical terms, the operator substitutes his or her judgment for that of the pulse width measure circuit 44 by manually selecting which of the four AND gates 68 is to be enabled.

Although particular embodiments of the invention have been described and illustrated herein, it is recognized that modifications and variations may readily occur to those skilled in the art and, consequently, it is intended that the claims be interpreted to cover such modifications and equivalents.

The embodiments of the invention in which an exclusive property or privilege is claimed are described as follows:

1. Apparatus for sampling a time-varying signal waveform at precise locations in time comprising:
   source means providing clock pulses at a first rate;
   means for detecting a predetermined characteristic of said waveform;
   means responsive to the detection of said predetermined characteristic and said source means for generating a series of strobe pulses at a second rate lower than said first rate; and
   means for producing a digital code representing the amplitude of said waveform in response to each of said strobe pulses.

2. Apparatus as recited in claim 1, wherein said source means comprise an oscillator connected in a phase-locked loop comprising a frequency divider connected to receive said clock pulse output from said oscillator and supply pulses at a third rate lower than said second rate;
- a reference oscillator for generating a stable signal output at approximately the same said third rate; and
- a phase comparator unit having as its input the pulses supplied by said frequency divider and the signal output generated by said reference oscillator, said phase comparator applying a feedback signal to said source means oscillator for increasing the accuracy and stability thereof.

3. Apparatus as recited in claim 1, wherein said means for detecting a predetermined characteristic comprises edge detector means for ascertaining the time location of a leading edge of said signal waveform.

4. Apparatus as recited in claim 3, wherein said edge detector means additionally ascertains the time location of the trailing edge of said signal waveform.

5. Apparatus as recited in claim 1, wherein said means responsive to the detection of said waveform characteristic and said source means comprises a frequency divider for producing said strobe pulses at said second rate.

6. Apparatus as recited in claim 1, wherein said means for producing said digital codes comprises an analog-to-digital converter receiving as input said waveform, said converter sampling said time varying waveform at said second rate.

7. The apparatus of claim 1 including means for storing selected ones of said digital codes produced in response to said strobe pulses.

8. Apparatus as recited in claim 7, wherein said means for storing selected digital codes includes pulse width measuring means for determining the time duration of said signal waveform; and
- means responsive to said signal waveform exceeding a predetermined duration for storing fewer than all of said digital codes produced.

9. An apparatus useful in multiple signal processing networks for identifying a distinctive input signal waveform, said waveform having both a leading and a trailing edge, comprising:
- source oscillator means for generating a succession of high-frequency clock pulses;
- strobe pulse generator means connected to said source oscillator means and responsive to said waveform leading edge for producing strobe pulses at a lower rate than said clock pulses but synchronized therewith;
- analog-to-digital converter means connected to said strobe pulse generator means and responsive to each strobe pulse for converting said input signal waveform into corresponding digital data samples; and
- memory means connected to said converter means for storing a predetermined proportion of said data samples.

10. The apparatus of claim 9 wherein said means for storing data samples includes pulse width measuring means for determining the time duration of said waveform; and
- means responsive to said waveform exceeding a predetermined duration for storing fewer than all of said data samples.

* * * * *